United States Patent
Ito et al.

(10) Patent No.: US 11,506,718 B2
(45) Date of Patent: Nov. 22, 2022

(54) BATTERY MONITORING DEVICE

(71) Applicant: DENSO CORPORATION, Kariya (JP)

(72) Inventors: Masahiko Ito, Kariya (JP); Shunichi Kubo, Kariya (JP); Hayato Mizoguchi, Kariya (JP)

(*) Notice: Subject to any disclaimer, the term of this patent is extended or adjusted under 35 U.S.C. 154(b) by 507 days.

(21) Appl. No.: 16/523,788

(22) Filed: Jul. 26, 2019

(65) Prior Publication Data
US 2020/0033412 A1 Jan. 30, 2020

(30) Foreign Application Priority Data
Jul. 30, 2018 (JP) .............................. JP2018-142390

(51) Int. Cl.
*G01R 31/364* (2019.01)
*G01R 1/20* (2006.01)
*G01R 31/396* (2019.01)
*G01R 31/3835* (2019.01)
*H01M 10/48* (2006.01)

(52) U.S. Cl.
CPC ........... *G01R 31/364* (2019.01); *G01R 1/203* (2013.01); *G01R 31/3835* (2019.01); *G01R 31/396* (2019.01); *H01M 10/482* (2013.01)

(58) Field of Classification Search
CPC ................ G01R 31/364; G01R 31/396; G01R 31/3835; G01R 1/203; H01M 10/482
See application file for complete search history.

(56) References Cited

U.S. PATENT DOCUMENTS

| 2013/0308354 | A1* | 11/2013 | Sato ........................ H02M 1/14 363/45 |
| 2015/0044531 | A1* | 2/2015 | Itagaki ................. G01R 31/374 429/90 |
| 2017/0117596 | A1* | 4/2017 | Kubo .................... G01R 31/396 |
| 2019/0260095 | A1* | 8/2019 | Machida ............... H01M 10/48 |

FOREIGN PATENT DOCUMENTS

JP            6111848 B2      4/2017

* cited by examiner

*Primary Examiner* — Alexander Satanovsky
*Assistant Examiner* — Sharah Zaab (57) ABSTRACT

A connection part which connects a terminal part and a processing part include an equalization resistor that is inserted into each main line and a 0-Ω resistor that is a short circuit line for short circuiting a main line of a first terminal and a main line of a second terminal. In the terminal part, the second terminal s unused, and a battery cell adjacent to a high-potential side of a stack bar is connected between the first terminal and a third terminal.

11 Claims, 5 Drawing Sheets

BATTERY MONITORING DEVICE

CROSS-REFERENCE TO RELATED APPLICATION

This application is based on and claims the benefit of priority from earlier Japanese Patent Application No. 2018-142390 filed Jul. 30, 2018, the description of which is incorporated herein by reference.

TECHNICAL FIELD

The present disclosure relates to a technique for individually monitoring a plurality of battery cells connected in series.

BACKGROUND

A battery pack used in an electric car, a hybrid car or the like has a structure including a plurality of battery stacks in combination. Each of the battery stacks has a structure including a plurality of battery cells connected in series. A bus bar (hereinafter referred to as "stack bar") which mutually connects the battery cells across the battery stacks is longer and has a greater resistance than a bus bar (hereinafter referred to as "cell bar") which mutually connects the battery cells in the same battery stack.

SUMMARY

A battery monitoring device in an aspect includes a terminal part, a processing part, and a connection part.

The terminal part has M+1 connection terminals, where M is a positive integer of 3 or more. A stack bar, which is a bus bar for mutually connecting battery stacks, or a plurality of battery cells, is connected between the respective connection terminals so that the battery cells are connected in series.

The processing part has M processing blocks which are each provided for each adjacent terminal pair, where i is $1 \leq i \leq M$, the adjacent terminal pair is a set of the $i^{th}$ connection terminal and the $(i+1)^{th}$ connection terminal. The M processing blocks each have a processing circuit that executes processing according to the terminal-to-terminal voltage of the adjacent terminal pair and a short circuit switch that short circuits or disconnects the connection terminals of the adjacent terminal pair.

The connection part connects the terminal part and the processing part. Here, in a stack connection pair which is the adjacent terminal pair to which the stack bar is connected, the connection terminal positioned on a high-potential side is defined as a first terminal. The connection terminal positioned on a higher-potential side than the first terminal and forming the adjacent terminal pair together with the first terminal is defined as a second terminal, and the connection terminal positioned on a higher-potential side than the second terminal and forming the adjacent terminal pair together with the second terminal is defined as a third terminal.

The connection part includes a resistor and a short circuit line. The resistor is provided for each of the connection terminals, and inserted in series into each main line that is a conductive line extending from the connection terminal to the short circuit switch. The short circuit line short-circuits a main line of the first terminal and a main line of the second terminal.

In the terminal part, the second terminal is unused, and the battery cell adjacent to the high-potential side of the stack bar is connected between the first and third terminals.

DETAILED DESCRIPTION OF THE PREFERRED EMBODIMENTS

JP 6111848 B discloses a technique of measuring the voltage between both ends of stack bars separately from that of battery cells and detecting abnormalities in coupling parts to which the stack bars are connected based on the detected voltage values.

Note that detection circuits which detect the voltage between both ends of the battery cells and the stack bars individually each have a detection route which connects the battery cells or the stack bars. The adjacent detection routes are configured so that the route on a high-potential side in the one detection route and the route on a low-potential side in the other detection route are shared. Hereinafter, the detection route to which the detection circuit for detecting the voltage between both ends of the stack bars is connected is defined as a stack detection route, and the detection route to which the detection circuit for detecting the voltage between both ends of the battery cells is connected is defined as a cell detection route.

However, as a result of the inventor's detailed reviews, the conventional technique disclosed in JP 6111848 B has been found to involve the problem that, when the technique is applied to vehicles in which the charge/discharge current of batteries is large, such as electric vehicles and plug-in hybrid vehicles, the detected values of the voltage between both ends may still include an error in the battery cells adjacent to the stack bars.

That is, in vehicles in which the charge/discharge current is large, the voltage generated between the stack bars becomes very high. Especially during battery discharge, high negative voltage in the opposite direction to that of the battery voltage is generated between the stack bars. Then, a parasitic diode provided in the stack detection route turns on, whereby current flows into the stack detection route via the parasitic diode. As a result, in the cell detection route adjacent to the stack detection route, a voltage drop occurs across the resistance component on the route shared with the stack detection route, and errors may be included in the detected values of the voltage between both ends of the battery cells.

One aspect of the present disclosure is to provide a technique for suppressing a detection error of the cell voltage due to the influence of a stack bar which mutually connects battery stacks.

One embodiment of the present disclosure is a battery monitoring device including a terminal part, a processing part, and a connection part.

The terminal part has M+1 connection terminals, where M is a positive integer of 3 or more. A stack bar, which is a bus bar for mutually connecting battery stacks, or a plurality of battery cells, is connected between the respective connection terminals so that the battery cells are connected in series.

The processing part has M processing blocks which are each provided for each adjacent terminal pair, where i is $1 \leq i \leq M$, the adjacent terminal pair is a set of the $i^{th}$ connection terminal and the $(i+1)^{th}$ connection terminal. The M processing blocks each have a processing circuit that executes processing according to the terminal-to-terminal voltage of the adjacent terminal pair and a short circuit switch that short circuits or disconnects the connection terminals of the adjacent terminal pair.

The connection part connects the terminal part and the processing part. Here, in a stack connection pair which is the adjacent terminal pair to which the stack bar is connected, the connection terminal positioned on a high-potential side is defined as a first terminal. The connection terminal positioned on a higher-potential side than the first terminal and forming the adjacent terminal pair together with the first terminal is defined as a second terminal, and the connection terminal positioned on a higher-potential side than the second terminal and forming the adjacent terminal pair together with the second terminal is defined as a third terminal.

The connection part includes a resistor and a short circuit line. The resistor is provided for each of the connection terminals, and inserted in series into each main line that is a conductive line extending from the connection terminal to the short circuit switch. The short circuit line short-circuits a main line of the first terminal and a main line of the second terminal.

In the terminal part, the second terminal is unused, and the battery cell adjacent to the high-potential side of the stack bar is connected between the first and third terminals.

According to such a configuration, the stack bar is excluded from the conductive line that connects the adjacent terminal pair to which the battery cell is connected and the processing part having the processing block which is being corresponded to the adjacent terminal pair, thereby making it possible to suppress processing accuracy from deteriorating in the processing part due to the influence of the stack bar.

Further, the first and second terminals are short-circuited by the short circuit line, and the battery cell (hereinafter referred to as a high-potential-side cell) adjacent to the high-potential side of the stack bar is processed by the processing block being corresponded to the adjacent terminal pair including the second and third terminals.

Therefore, it is possible to suppress processing accuracy from deteriorating at the processing block, which executes the processing of the high-potential-side cell, due to the effect of noise current flowing when a negative voltage occurs in the stack connection pair.

That is, a negative voltage may be generated at both ends of the stack bar, for example, by discharge of the battery cell or noise coming from the external. Upon generation of such a negative voltage, noise current flows via a parasitic diode possessed by the short circuit switch in a closed loop formed by the processing block being corresponded to the stack connection pair and the stack bar. This noise current produces a voltage drop across the resistor inserted into the main line of the first terminal. Specifically, the processing block which uses the main line of the first terminal is affected by the noise current. Therefore, this processing block cannot be used, and, further, the processing block corresponding to the second and third terminals adjacent to the high-potential side is used for processing of the high-potential-side cell. Thus, it is possible to suppress processing accuracy from deteriorating at the processing block for the high-potential-side cell due to the noise current.

Hereinafter, embodiments of the present disclosure will be described with reference to the drawings.

1. First Embodiment

[1-1. Configuration]

Figure 1:
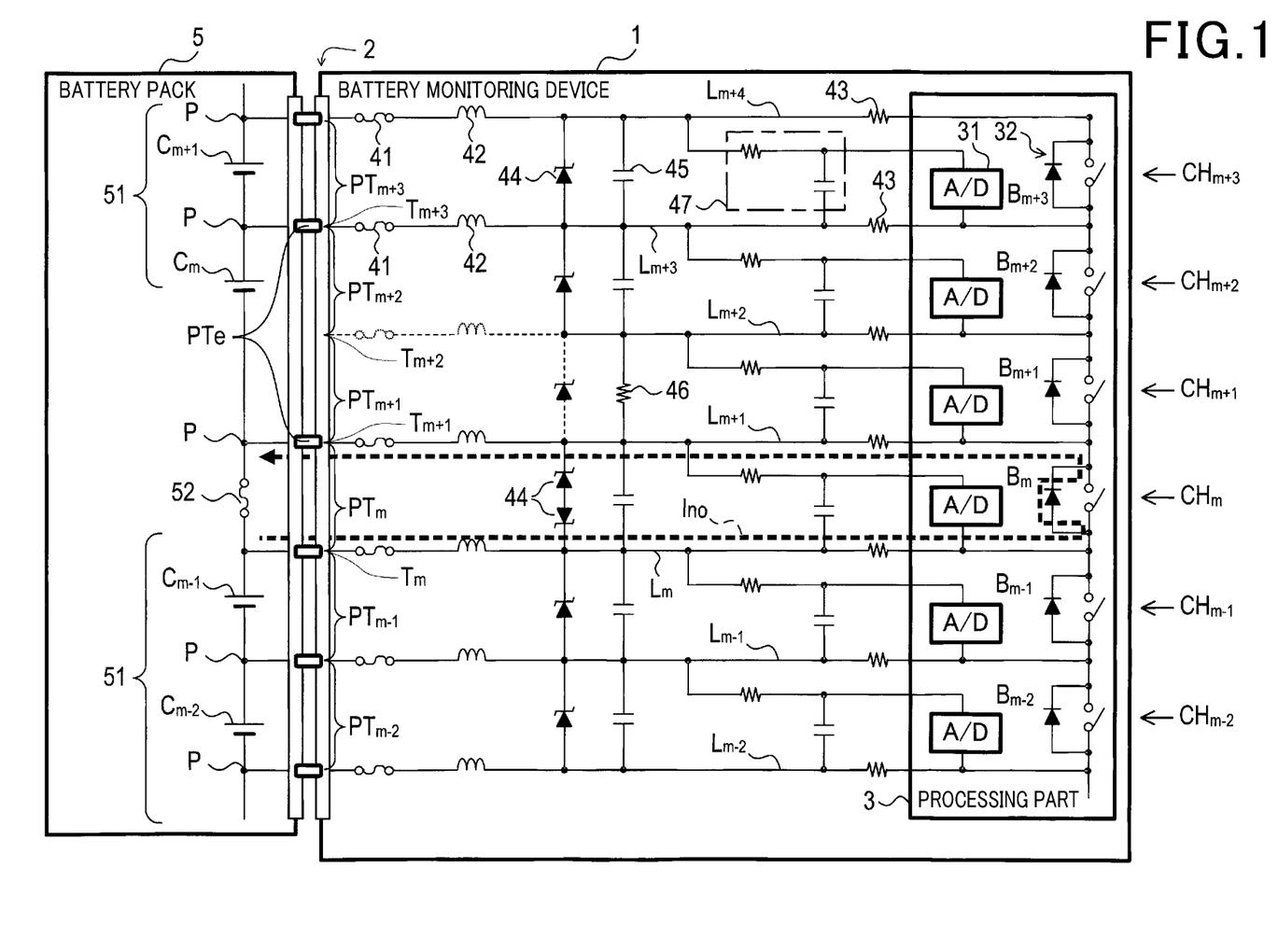
FIG. 1 is a circuit diagram showing a configuration of a battery monitoring device according to a first embodiment.

A battery monitoring device 1 shown in FIG. 1 is a device which is connected to a battery pack 5 having a plurality of battery cells C connected in series to monitor the charged state of each of the battery cells C. The battery cells C are secondary batteries.

The battery pack 5 has a structure including a plurality of battery stacks 51 in combination. Each of the battery stacks 51 has a structure including the plurality of battery cells connected in series.

Figure 2:
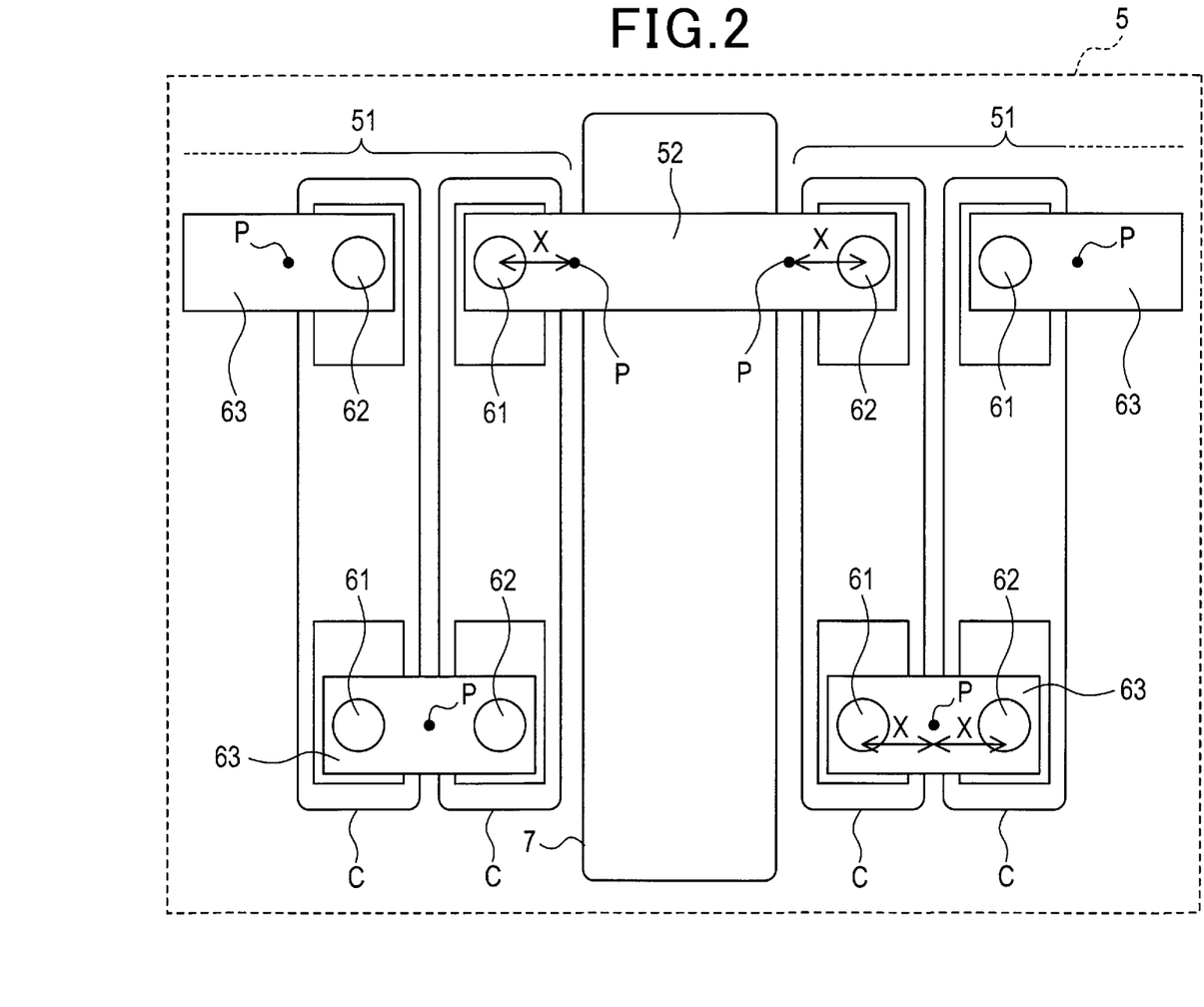
FIG. 2 is an explanatory view showing a connection state between battery stacks and between battery cells in a battery pack.

A positive electrode terminal 61 and a negative electrode terminal 62 are provided on the upper surface of the respective battery cells C, as shown in FIG. 2. The plurality of battery cells C belonging to the same battery stack 51 are arranged so that the adjacent battery cells C are opposite in terms of the arrangement order of the positive electrode terminal 61 and the negative electrode terminal 62. The positive electrode terminal 61 of the adjacent one battery cell C and the negative electrode terminal 62 of another battery cell C are connected via a bus bar 63 (hereinafter referred to as a cell bar).

In addition, the plurality of battery stacks 51 are arranged so that the positive electrode terminal 61 of the battery cell belonging to the adjacent one battery stack 51 and the negative electrode terminal 62 of the battery cell C belonging to another battery stack 51 are opposite to each other via a spacer 7, and are connected via a bus bar 52 (hereinafter referred to as a stack bar). That is, the stack bar 52 has a length across the spacers 7, and thus is longer and has a greater resistance component than the cell bars 63. The bus bars 52, 63 are plate-shaped members having conductivity.

Note that on the respective cell bars 63, a position located at equal intervals from both ends connected to the positive electrode terminal 61 and the negative electrode terminal 62 serves as a connection point to a connection terminal which will be described later. The distance from these terminals 61, 62 to the connection point is defined as X. On the stack bar 52, two points which are distant by the distance X from the positive electrode terminal 61 and the negative electrode terminal 62, respectively, serve as connection points to the connection terminals.

Returning to FIG. 1, the battery monitoring device 1 has a terminal part 2, a processing part 3 and a connection part 4, and these parts 2, 3, 4 are integrally constituted on an electronic circuit board.

The terminal part 2 has M+1 connection terminals. M is an integer of 3 or more. In addition, i is defined as an integer such that $1 \leq i \leq M$, and a terminal pair formed of the $i^{th}$ connection terminal $T_i$ and the $(i+1)^{th}$ connection terminal $T_{i+1}$ is defined as an adjacent terminal pair $PT_i$.

FIG. 1 shows a total of four battery cells $C_{m-2}$ to $C_{m+1}$, which are composed of two battery cells C adjacent to each end of the stack bar 52, and a circuit associated with these battery cells $C_{m-2}$ to $C_{m+1}$ and the stack bar 52, when the stack bar 52 is connected to an $m^{th}$ adjacent terminal pair (hereinafter referred to as a stack terminal pair) $PT_m$; m is an integer such that $2 \leq m \leq M-1$.

Of the stack terminal pair $PT_m$, a connection terminal $T_{m+1}$ on the side connected to the negative electrode terminal of a battery cell $C_m$ adjacent to the stack bar 52 is referred to as high-potential side, and a connection terminal $T_m$ on the side connected to the positive electrode terminal of a battery cell $C_{m-1}$ adjacent to the stack bar 52 is referred to as low-potential side. Hereinafter, of the stack terminal pair $PT_m$, the connection terminal $T_{m+1}$ on the high-potential side is referred to as a first terminal. A connection terminal $T_{m+2}$ positioned on a higher-potential side than the first terminal $T_{m+1}$ and forming an adjacent terminal pair $PT_{m+1}$ together with the first terminal $T_{m+1}$ is referred to as a second terminal, and a connection terminal $T_{m+3}$ positioned on a higher-potential side than the second terminal $T_{m+2}$ and forming an adjacent terminal pair $PT_{m+2}$ together with the second terminal $T_{m+2}$ is referred to as a third terminal.

That is, the battery cells C are connected to the respective adjacent terminal pairs $PT_i$ which do not include one of the first terminal $T_{m+1}$ and the second terminal $T_{m+2}$, and also connected between the first terminal $T_{m+1}$ and the third terminal $T_{m+3}$. Hereinafter, the first terminal $T_{m+1}$ and the third terminal $T_{m+3}$ are referred to as a specific terminal pair PTe.

The processing part 3 has M processing blocks B being corresponded to M adjacent terminal pairs PT, respectively. The processing part 3 has M+1 common terminals CT and M of the AD conversion terminals AT. As for the conversion terminals CT and the AD conversion terminals AT, FIG. 3 may be referred. The processing part 3 may be realized by a semiconductor integrated circuit.

Figure 3:
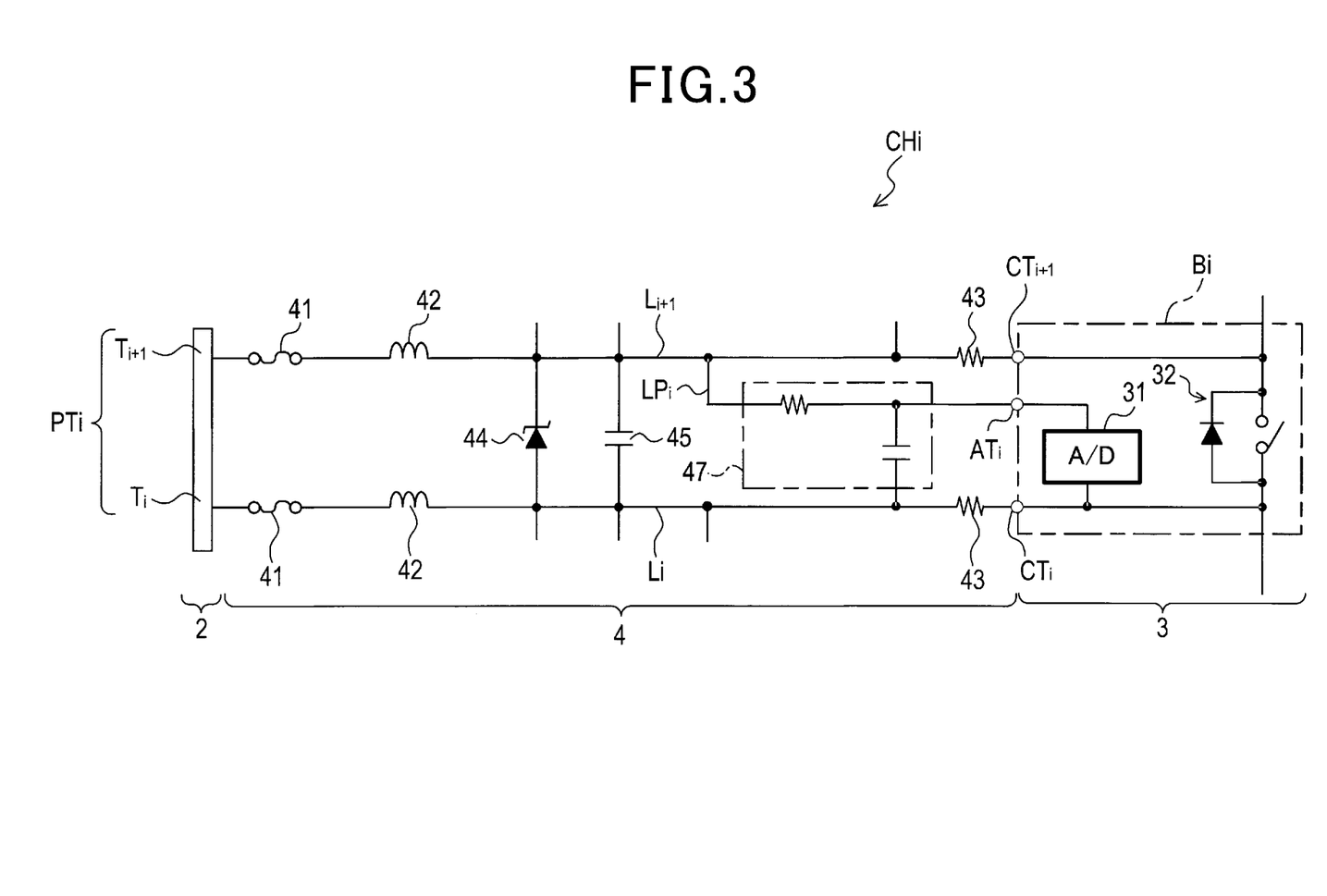
FIG. 3 is a circuit diagram showing a basic configuration of a channel.

The processing blocks $B_i$ are all configured in the same manner, and each include an AD converter 31 and a short circuit switch 32 as shown in FIG. 3. In addition, common terminals $CT_i$, $C_{i+1}$ and an AD conversion terminal $AT_i$ correspond to the respective processing blocks $B_i$.

The AD converter 31 of the processing block $B_i$ converts the voltage between the AD converter terminal $AT_i$ and the common terminal $CT_i$ into a digital value and outputs the value to an external device not shown. The short circuit switch 32 of the processing block $B_i$ is a transistor which is on/off-operated according to instructions from the external device, and which short circuits or disconnects the common terminals $CT_i$, $CT_{i+1}$. This transistor has a parasitic diode. When the potential of the common terminal $CT_i$ becomes higher than that of the common terminal $CT_{i+1}$ for some reason so that reverse voltage is applied to the transistor, the common terminals $CT_i$ and $CT_{i+1}$ are electrically connected to each other via the parasitic diode.

As shown in FIG. 3, the connection part 4 has main lines $L_i$ which are M+1 conductive lines that connect the connection terminal $T_i$ and the common terminal $CT_i$. The AD conversion terminal $AT_i$ of the processing block $B_i$ is connected to a branch line $LP_i$ branched from a main line $L_{i+1}$. Hereinafter, the adjacent terminal pair $PT_i$, the processing block $B_i$ and a part of the connection part 4 which connects them are referred to collectively as channel $CH_i$.

To each of the main lines $L_i$, a fuse 41, an inductor 42 and an equalization resistor 43 are connected, in this order, in series in a direction from the connection terminal $T_i$ toward the common terminal $CT_i$. In the respective channels $CH_i$, a Zener diode 44 and a capacitor 45 which connect the main lines $L_i$ and $L_{i+1}$ are provided in parallel between the inductor 42 and the equalization resistor 43. The Zener diode 44 has an anode connected to the main line $L_i$ and a cathode connected to the main line $L_{i+1}$, and is electrically conducted when positive overvoltage, which is not lower than the breakdown voltage, is applied between the main lines $L_i$ and $L_{i+1}$.

The branch line $LP_i$ is branched from between the inductor 42 and the equalization resistor 43 on the main line $L_{i+1}$, and connected to the AD conversion terminal $AT_i$ via a low pass filter 47.

In the respective channels $CH_i$, the inductor 42 and the capacitor 45 constitute a filter circuit. The fuse 41 corresponds to a disconnection element, and the Zener diode 44 corresponds to a protection circuit.

However, a channel $CH_m$ including a stack connection pair $PT_m$ and two channels $CH_{m+1}$, $CH_{m+2}$ adjacent to the high-potential side of the stack connection pair $PT_m$ are configured differently from the basic configuration shown in FIG. 3.

As shown in FIG. 1, in the channel $CH_m$, two Zener diodes 44, which are connected in series so that their anodes are connected to each other, are used in place of the single Zener diode 44. That is, the channel $CH_m$ is configured to electrically connect the main lines $L_m$, $L_{m+1}$ not only when positive overvoltage is applied between the main lines $L_m$, $L_{m+1}$, but also when negative overvoltage is applied therebetween.

On the main line $L_{m+2}$ which is a main line on the high-potential side of the channel $CH_{m+1}$ and is also a main line on the low-potential side of the channel $CH_{m+2}$, the implementation of the fuse 41 and the inductor 42 is omitted as shown by a dotted line in FIG. 1, and setting is made so that the second terminal $T_{m+2}$ and the main line $L_{m+2}$ are not electrically connected to each other.

Further, in the channel $CH_{m+1}$, the implementation of the Zener diode 44 and the capacitor 45 is omitted. Instead, a 0-Ω resistor 46 is mounted to form a short circuit route between the main lines $L_{m+1}$, $L_{m+2}$. That is, the 0-Ω resistor 46 is used to short circuit the input end of the processing block $B_{m+1}$, so that the channel $CH_{m+1}$ becomes an unused channel, and the use of the processing block $B_{m+1}$ by the external device is prohibited. Furthermore, the voltage between both ends of the battery cell $C_m$ connected between the connection terminals of the specific terminal pair PTe, i.e., the battery cell $C_m$ adjacent to the high-potential side of the stack bar 52, is processed by a processing block $B_{m+2}$ in the channel $CH_{m+2}$.

[1-2. Operation]

In the respective channels $CH_i$ other than the channels $CH_m$, $CH_{m+1}$, and $CH_{m+2}$, the AD converter 31 converts the voltage between both ends of the battery cell C connected to the adjacent terminal pair $PT_i$ into a digital value and outputs the value to the external device.

In the channel $CH_{m+2}$, the AD converter 31 converts the voltage between both ends of the battery cell C connected to the specific terminal pair PTe into a digital value and outputs the value to the external device.

In the channel $CH_m$, the AD converter 31 converts the voltage between both ends of the stack bar 52 connected to the stack terminal pair $PT_m$ into a digital value and outputs the value to the external device.

In the respective channels other than the channels $CH_m$ and $CH_{m+1}$, i.e., the channels CH which detect the voltage between both ends of the battery cells C, the short circuit switch 32 is appropriately turned on/off according to instructions from the external device. Specifically, the short circuit switches 32 are controlled so that the battery cells C having relatively high voltage between both ends are discharged, thereby compressing the variation in voltage between both ends among the battery cells C belonging to the battery pack 5.

The adjacent terminal pair $PT_i$ or specific terminal pair PTe to which the battery cell C is connected is defined as a battery connection pair. When positive overvoltage, which is higher than the breakdown voltage of the Zener diode 44, is applied between the connection terminals of the battery connection pair, the Zener diode 44 is electrically conducted in the channels other than the channel $CH_{m+1}$. Thus, the processing blocks B are protected from such overvoltage. In addition, the blowout of the fuse 41 by large current flowing via the Zener diode 44 at this time, which leads to continuous flow of large current, is inhibited.

The stack connection pair $PT_m$ to which the stack bar 52 is connected is not brought in a state in which positive voltage is always applied, unlike the adjacent terminal pair $PT_i$ or specific terminal pair PTe to which the cell C is connected. Therefore, negative voltage may be generated at both ends of the stack bar 52, for example, by external noise and the charging/discharging operation of the battery pack 5. The channel $CH_m$ has two Zener diodes 44 oppositely connected in series, and thus the processing block $B_m$ is protected from both positive overvoltage and negative overvoltage.

When negative voltage is generated at both ends of the stack bar 52, noise current Ino flows in a direction of the connection terminal $T_m$, the main line $L_m$, the parasitic diode 32 of the short circuit switch, the main line $L_{m+1}$, and connection terminal $T_{m+1}$ in this order. This noise current Ino causes error voltage $\Delta V$ according to the noise current Ino in the equalization resistor 43 on the main line $L_{m+1}$, resulting in variation in potential on the low-potential side of the processing block $B_{m+1}$. Thus, an error occurs in the detection results of the AD converter 31 in the channel $CH_{m+1}$. Additionally, the influence of the noise current Ino is more prominent when the battery pack 5 which must flow large current is used, for example, in electric vehicles.

On the contrary, the equalization resistor 43 on the main line $_{m+1}$ is not included in a closed loop formed including the AD converter 31 in the channel $CH_{m+2}$, the cell $C_m$ connected to the specific terminal pair PTe and the 0-Ω resistor 46. Accordingly, the AD converter 31 in the channel $CH_{m+2}$ is not affected by the noise current Ino flowing through the channel $CH_m$.

[1-3. Effects]

The first embodiment described in detail above provides the following effects.

(1a) The channel $CH_{m+1}$ adjacent to the high-potential side of the channel $CH_m$ associated with the stack connection pair $PT_m$ is used as an unused channel, and the channel $CH_{m+2}$ adjacent to a higher-potential side executes processing of the cell $C_m$ adjacent to the high-potential side of the stack bar 52.

Thus, it is possible to suppress detection accuracy of the voltage from deteriorating between both ends of the respective cells C due to the influence of the noise current Ino flowing due to negative voltage even if the negative voltage is generated at both ends of the stack bar 52, for example, by external noise and discharge from the battery pack 5.

(1b) Since the connection part 4 is constituted on the circuit board, the circuit configuration of the respective channels $CH_i$ can be arbitrarily changed only by switching of the implementation of the components. That is, it is not necessary to change the design of the circuit board, to whichever adjacent terminal pair $PT_i$ the stack bar 52 is connected. Therefore, the circuit board of the battery monitoring device 1 can be used in common in a plurality of types of vehicles.

(1c) Since neither the fuse 41 nor the inductor 42 is implemented on the main line $L_{m+2}$ of the second terminal $T_{m+2}$ which is unused, large current would not flow via the 0-Ω resistor 46 even if the battery cell C is erroneously connected between the second terminal $T_{m+2}$ and the first terminal $T_{m+1}$. As a result, it is possible to suppress the device from getting failed due to erroneous connection.

2. Second Embodiment

[2-1. Difference from First Embodiment]

Since a second embodiment is similar in basic configuration to the first embodiment, differences will be described below. Since the same reference numerals as those used in the first embodiment represent the same configurations, the preceding explanations are referred.

The present embodiment is different from the first embodiment in the configuration of the protection circuit with respect to the specific terminal pair PTe.

Figure 4:
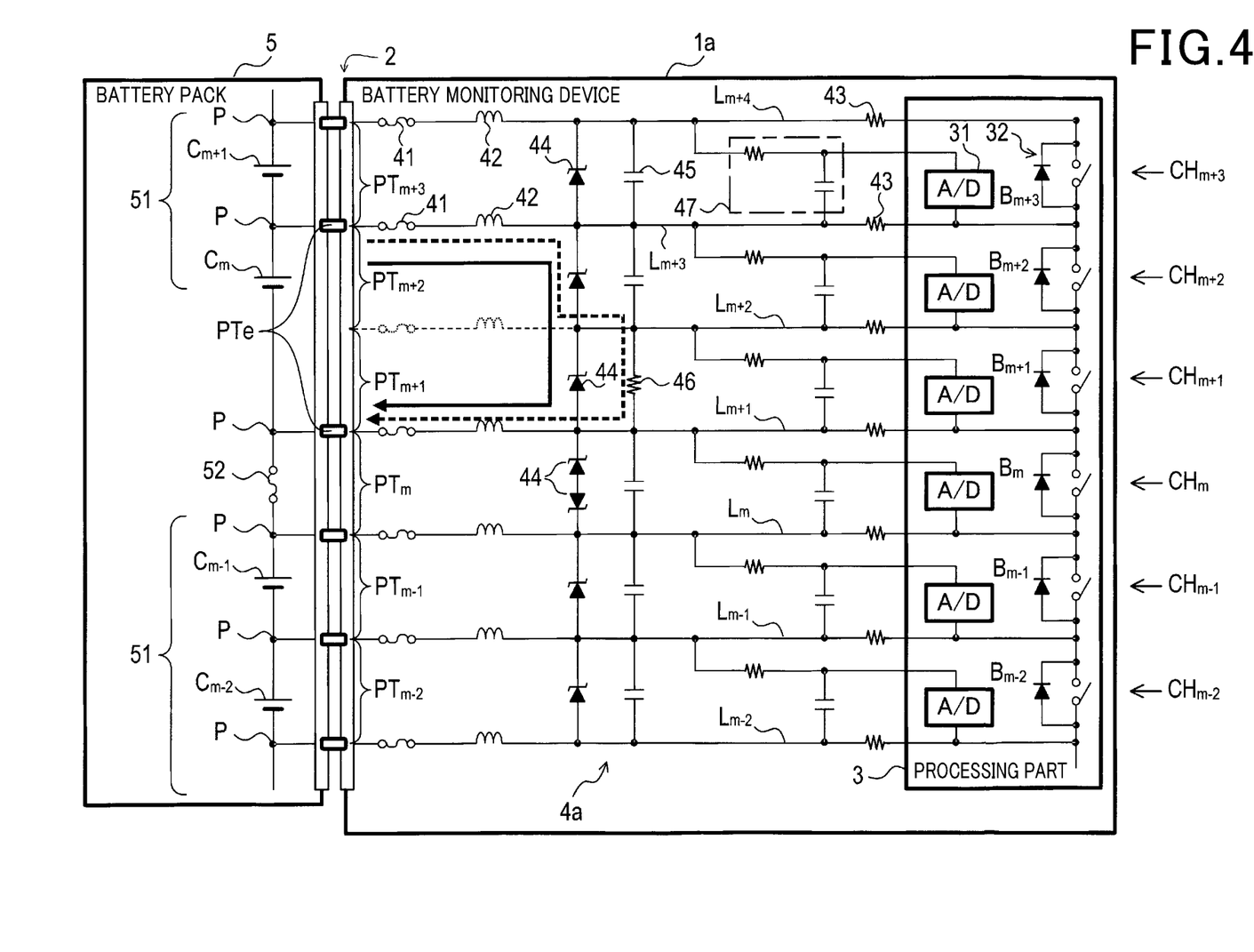
FIG. 4 is a circuit diagram showing a configuration of a battery monitoring device according to a second embodiment.

As shown in FIG. 4, a battery monitoring device 1a of the present embodiment is different in the configuration of a connection part 4a, especially the configuration of the channel $CH_{m+1}$ related to the specific terminal pair PTe. Specifically, the channel $CH_{m+1}$, which is an unused channel, is also provided with the Zener diode 44 in parallel with the 0-Ω resistor 46. That is, as the protection circuit with respect to the specific terminal pair PTe, the only one Zener diode 44 which is provided in the channel $CH_{m+2}$ is employed in the first embodiment, but two Zener diodes 44 which are provided in the channels $CH_{m+1}$ and $CH_{m+2}$ are employed in the present embodiment.

[2-2. Operation]

In the first embodiment, when positive overvoltage, which is higher than the breakdown voltage, is applied to the specific terminal pair PTe, the Zener diode 44 in the channel $CH_{m+2}$ is electrically conducted, thereby protecting the processing block $B_{m+2}$ from such overvoltage. The short circuit current at this time flows through the 0-Ω resistor 46. The processing block $B_{m+1}$ is protected from overvoltage as well as from overcurrent due to the fact that the 0-Ω resistor 46 is connected. However, when the 0-Ω resistor 46 is disconnected by this short circuit current before blowout of the fuse 41, the short circuit current flows into the processing block $B_{m+1}$.

On the other hand, in the present embodiment, even if the 0-Ω resistor 46 is disconnected, the application of overvoltage to the Zener diode 44 connected in parallel with the 0-Ω resistor 46 results in electric conduction of the Zener diode 44. Therefore, the flow of overcurrent into the processing block $B_{m+1}$ is inhibited.

[2-3. Effects]

The second embodiment described in detail above provides the effects (1a) to (1c) of the first embodiment described above, and further provides the following effect.

(2a) Since the Zener diode 44 is mounted also in the unused channel $CH_{m+1}$, the processing part 3 and therefore the battery monitoring device 1a can be protected from defects caused by a failure, i.e., disconnection of the 0-Ω resistor 46.

3. Third Embodiment

[3-1. Difference from First Embodiment]

Since the third embodiment is similar in basic configuration to the first embodiment, differences will be described below. Since the same reference numerals as those used in the first embodiment represent the same configurations, the preceding explanations are referred.

The present embodiment is different from the first and second embodiments in the configuration of the protection circuit with respect to the specific terminal pair PTe.

Figure 5:
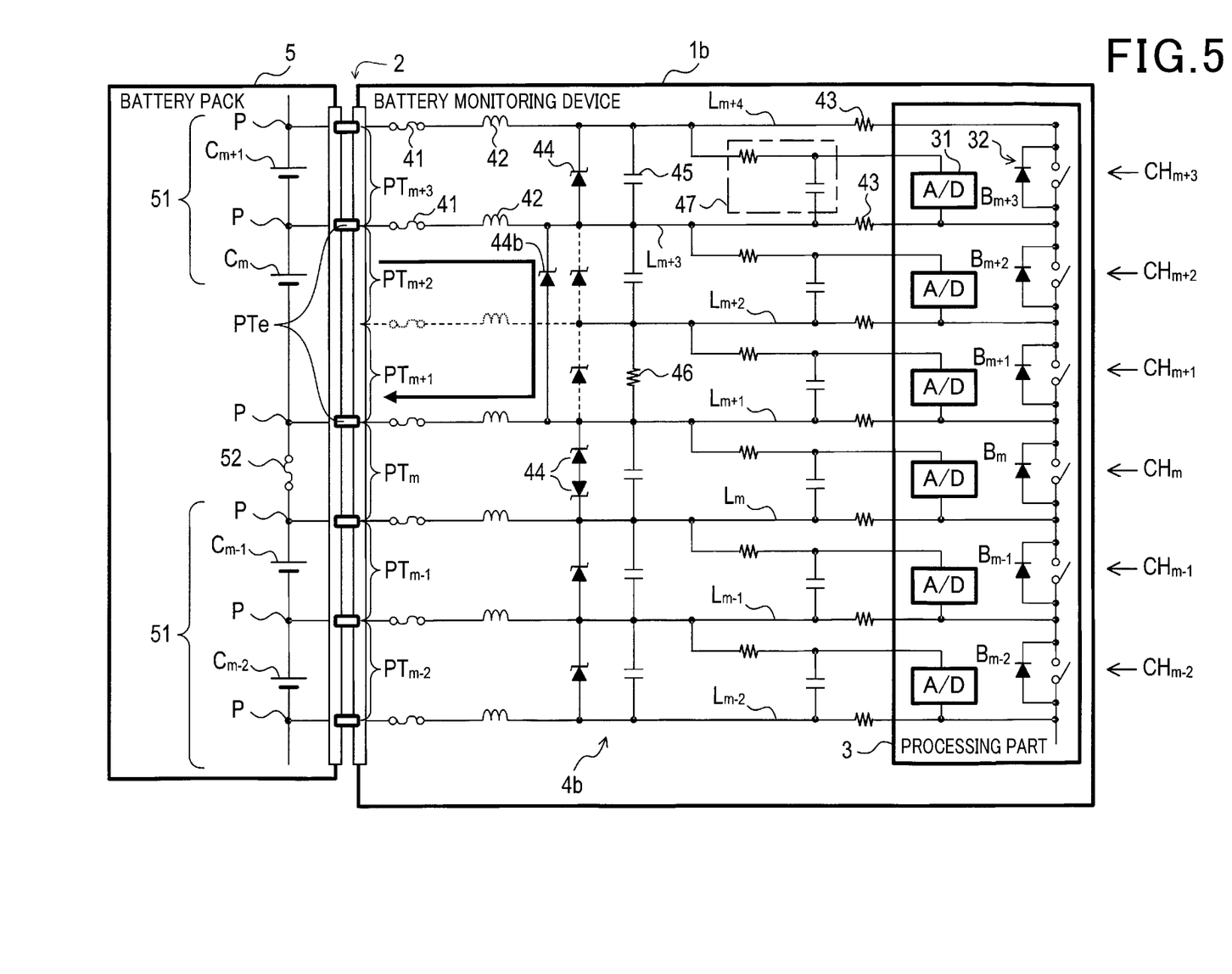
FIG. 5 is a circuit diagram showing a configuration of a battery monitoring device according to a third embodiment.

As shown in FIG. 5, a battery monitoring device 1b of the present embodiment is different in the configuration of a connection part 4b, especially, the configurations of the channels $CH_{m+1}$ and $CH_{m+2}$ related to the specific terminal pair PTe. Specifically, the Zener diode 44 in the channel $CH_{m+1}$ that connects the main lines $L_m$, $L_{m+1}$ and the channel $CH_{m+2}$ that connects the main lines $L_{m+1}$, $L_{m+2}$ are omitted. Instead, a Zener diode 44b that connects the main lines $L_m$, $L_{m+2}$ is provided.

[3-2. Operation]

In the case of the second embodiment, when overvoltage is generated at the specific terminal pair PTe, the Zener diode 44 in the unused channel $CH_{m+1}$ is not brought in a breakdown state until the overvoltage between the connection terminals of the specific terminal pair PTe becomes twice or more the breakdown voltage. Therefore, the time required for blowout of the fuse 41 may be longer than that in the case where overvoltage is applied to the other channels $CH_i$.

On the other hand, in the present embodiment, the Zener diode 44 that directly connects the main lines $L_m$, $L_{m+2}$ corresponding to the specific terminal pair PTe is provided. Therefore, in a time similar to that for the other channels CR, the Zener diode 44 is brought in the breakdown state, and, further, the fuse 41 is blown.

[3-3. Effects]

The third embodiment described in detail above provides the effects (1a) to (1c) of the first embodiment described above and the effect (2a), and further provides the following effect.

(3a) It is possible to suppress protection from delaying against overvoltage in the channels $CH_{m+1}$, $Chm+2_{m+2}$ corresponding to the specific terminal pair PTe as compared with that in the other channels CH, and to further improve the reliability of the device.

4. Other Embodiments

The embodiments of the present disclosure have been described above, but the present disclosure is not limited to the above-described embodiments, and can be implemented with various modifications.

(4a) In the above embodiments, the cases where the processing circuit possessed by the respective processing blocks Bi is the AD converter 31 have been illustrated. However, the present disclosure is not limited to these cases. It is only necessary that the circuit which executes processing according to the voltage between both ends of the adjacent terminal pair PTi should be included.

(4b) A plurality of functions implemented by one component in the above-described embodiments may be realized by a plurality of components, or one function implemented by one component may be realized by a plurality of components. Also, a plurality of functions implemented by a plurality of components may be realized by one component, or one function realized by a plurality of components may be realized by one component. Also, part of the configurations of the above-described embodiments may be omitted. Also, at least part of the configurations of the above-described embodiments may be added to or replaced with any other configurations of the above-described embodiments. All aspects falling within the technical idea specified from the wording of the claims are embodiments of the present disclosure.

(4c) In addition to the battery monitoring devices 1, 1a and 1b described above, the present disclosure can be realized in various forms such as a system including the battery monitoring device 1, 1a or 1b as a component.

What is claimed is:

1. A battery monitoring device comprising:
    a terminal part having M+1 connection terminals, where M is a positive integer of 3 or more, wherein a stack bar, which is a bus bar for mutually connecting battery stacks, or a plurality of battery cells, is connected between respective connection terminals so that the battery cells are connected in series;
    a processing part having M processing blocks which are each provided for each adjacent terminal pair, where i is $1 \leq i \leq M$ and that the adjacent terminal pair is a set of the $i^{th}$ connection terminal and the $i+1^{th}$ connection terminal, wherein the M processing blocks each have a processing circuit that executes processing according to a terminal-to-terminal voltage of the adjacent terminal pair and a short circuit switch that short-circuits or disconnects the connection terminals of the adjacent terminal pair; and
    a connection part which connects the terminal part and the processing part, wherein
    in a stack connection pair which is the adjacent terminal pair to which the stack bar is connected, a connection terminal positioned on a high-potential side is defined as a first terminal, the connection terminal positioned on a higher-potential side than the first terminal and forming the adjacent terminal pair together with the first terminal is defined as a second terminal, and the connection terminal positioned on a higher-potential side than the second terminal and forming the adjacent terminal pair together with the second terminal is defined as a third terminal, wherein
    the connection part comprises:
        a resistor which is provided for each of the connection terminals and inserted in series into each of a plurality of main lines, each main line, other than a main line of the second terminal, being a conductive line extending from the connection terminal to the short circuit switch, and the main line of the second terminal being a conductive line that does not extend from the second terminal to the short circuit switch; and
        a short circuit line which short-circuits a main line of the first terminal and the main line of the second terminal, and
    in the terminal part, a battery cell adjacent to the high-potential side of the stack bar is connected between the first and third terminals.

2. The battery monitoring device according to claim 1, wherein
    a pair of the connection terminals to which the battery cell is connected is defined as a battery connection pair, wherein the connection part further comprises:
- a protection circuit which is provided in the battery connection pair and the stack connection pair, respectively, and electrically connects the connection terminals of the battery connection pair when the terminal-to-terminal voltage of the battery connection pair exceeds a preset allowable range; and
- a disconnection element which is provided on each of the main lines associated with the connection terminals, other than the second terminal, and breaks each main line by current flowing upon actuation of the protection circuit.

3. The battery monitoring device according to claim 2, wherein
the protection circuit provided between the first and third terminals has a Zener diode connected between the main line of the second terminal and the main line of the third terminal.

4. The battery monitoring device according to claim 2, wherein
the protection circuit provided between the first and third terminals has two Zener diodes connected between the main line of the first terminal and the main line of the second terminal, and between the main line of the second terminal and the main line of the third terminal, respectively.

5. The battery monitoring device according to claim 2, wherein
the protection circuit provided between the first and third terminals has a Zener diode connected between the main line of the first terminal and the main line of the third terminal.

6. The battery monitoring device according to claim 1, wherein
the processing circuit is an analog/digital converter which converts the terminal-to-terminal voltage of the adjacent terminal pair into a digital value.

7. The battery monitoring device according to claim 2, wherein
the processing circuit is an analog/digital converter which converts the terminal-to-terminal voltage of the adjacent terminal pair into a digital value.

8. The battery monitoring device according to claim 3, wherein
the processing circuit is an analog/digital converter which converts the terminal-to-terminal voltage of the adjacent terminal pair into a digital value.

9. The battery monitoring device according to claim 4, wherein
the processing circuit is an analog/digital converter which converts the terminal-to-terminal voltage of the adjacent terminal pair into a digital value.

10. The battery monitoring device according to claim 5, wherein
the processing circuit is an analog/digital converter which converts the terminal-to-terminal voltage of the adjacent terminal pair into a digital value.

11. The battery monitoring device according to claim 1, wherein
the short circuit line which short-circuits the main line of the first terminal and the main line of the second terminal comprises a resistor that is electrically connected between the main line of the first terminal and the main line of the second terminal.

* * * * *

UNITED STATES PATENT AND TRADEMARK OFFICE
CERTIFICATE OF CORRECTION

| | |
|---|---|
| PATENT NO. | : 11,506,718 B2 |
| APPLICATION NO. | : 16/523788 |
| DATED | : November 22, 2022 |
| INVENTOR(S) | : Masahiko Ito et al. |

It is certified that error appears in the above-identified patent and that said Letters Patent is hereby corrected as shown below:

On the Title Page

Item (73), should read:
-- DENSO CORPORATION, Kariya (JP) --

Signed and Sealed this
Tenth Day of January, 2023

Katherine Kelly Vidal
*Director of the United States Patent and Trademark Office*